(12) United States Patent
An et al.

(10) Patent No.: US 10,094,730 B2
(45) Date of Patent: Oct. 9, 2018

(54) HIGH PRESSURE DYNAMIC MICRO DIFFERENTIAL PRESSURE GAUGE, AND METHODS FOR USING AND CHECKING THE SAME

(71) Applicants: China University of Petroleum-Beijing, Beijing (CN); Beijing Shida Rongzhi Science and Technology Limited Company, Beijing (CN)

(72) Inventors: Weiqing An, Beijing (CN); Xiang'an Yue, Beijing (CN); Wenhao Tian, Beijing (CN); Wei Fang, Beijing (CN); Xuegang Feng, Beijing (CN); Xin Fang, Beijing (CN); Jirui Zou, Beijing (CN)

(73) Assignees: China University of Petroleum-Beijing, Beijing (CN); Beijing Shida Rongzhi Science & Technology Ltd Co., Beijing (CN)

( * ) Notice: Subject to any disclaimer, the term of this patent is extended or adjusted under 35 U.S.C. 154(b) by 0 days.

(21) Appl. No.: 15/643,097

(22) Filed: Jul. 6, 2017

(65) Prior Publication Data
US 2018/0143094 A1 May 24, 2018

(30) Foreign Application Priority Data

Nov. 24, 2016 (CN) .......................... 2016 1 1050075

(51) Int. Cl.
*G01R 27/22* (2006.01)
*G01L 19/00* (2006.01)
(Continued)

(52) U.S. Cl.
CPC ........ *G01L 27/005* (2013.01); *G01L 19/0023* (2013.01); *G01L 23/10* (2013.01);
(Continued)

(58) Field of Classification Search
CPC ..... G01L 15/00; G01L 27/005; G01L 9/0054; G01N 11/08
(Continued)

(56) References Cited

U.S. PATENT DOCUMENTS 4,380,173 A * 4/1983 Wozniak ................. G01L 7/182
116/323
6,148,673 A * 11/2000 Brown ................ G01L 19/0038
257/676
(Continued)

FOREIGN PATENT DOCUMENTS

CN 201141794 Y 10/2008
CN 201803826 U 4/2011
(Continued)

OTHER PUBLICATIONS

Chinese Patent Appln. No. 201611050075.6. First Office Action and Search Report (dated Jul. 4, 2017).
(Continued)

*Primary Examiner* — Roy Y Yi
*Assistant Examiner* — Jeffrey Aiello
(74) *Attorney, Agent, or Firm* — Loza & Loza, LLP; Michael Fedrick

(57) ABSTRACT

A high pressure dynamic micro differential pressure gauge, and methods for using and checking the same. The high pressure dynamic micro differential pressure gauge comprises a set of vertical manometer tubes in communication with each other, where one or more manometer tubes are connected to a resistance meter through signal lines, and the resistance meter is connected to a data collection and processing control system. Each manometer tube is full of low conductivity buffer liquid and high conductivity manometric liquid. The resistance meter is configured to measure resistances in the one or more manometer tubes, and the data
(Continued)

collection and processing control system is configured to convert the resistances measured by the resistance meter into a differential pressure.

11 Claims, 1 Drawing Sheet

(51) Int. Cl.
    *G01L 23/10*     (2006.01)
    *G01L 27/00*     (2006.01)
    *G01L 13/06*     (2006.01)
    *G01L 13/02*     (2006.01)

(52) U.S. Cl.
    CPC ............ *G01R 27/22* (2013.01); *G01L 13/025* (2013.01); *G01L 13/06* (2013.01)

(58) Field of Classification Search
    USPC ............ 73/1.71, 715, 716, 736; 702/45, 156
    See application file for complete search history.

(56) References Cited

U.S. PATENT DOCUMENTS

| | | | | |
|---|---|---|---|---|
| 2005/0080550 A1* | 4/2005 | Nakamura | ................ | G01F 1/34 701/114 |
| 2006/0065057 A1* | 3/2006 | Sekoguchi | ............. | G01L 13/06 73/736 |
| 2008/0087096 A1* | 4/2008 | Schmuck | .............. | G01M 15/00 73/747 |
| 2012/0285262 A1* | 11/2012 | Kelley | ...................... | G01F 1/40 73/861.42 |
| 2017/0234455 A1* | 8/2017 | Hirata | ................. | F16K 37/0083 |

FOREIGN PATENT DOCUMENTS

| | | | | |
|---|---|---|---|---|
| CN | 103162896 A | | 6/2013 | |
| CN | 204594616 U | | 8/2015 | |
| CN | 105806545 A | | 7/2016 | |
| CN | 104748908 A | | 2/2017 | |
| CN | 104748908 B | * | 2/2017 | ............ G01L 13/00 |
| CN | 206223347 U | | 6/2017 | |
| WO | 2011153659 A1 | | 12/2011 | |

OTHER PUBLICATIONS

Second Office Action dated Oct. 16, 2017 for counterpart Chinese patent application No. 201611050075.6.

Search Report dated Oct. 16, 2017 for counterpart Chinese patent application No. 201611050075.6.

Hu, Hao, et al., "Actuality and Development of the Differential Pressure Sensor Technology," Machine Tool & Hydraulics, 41(11):187-190 (2013).

* cited by examiner

HIGH PRESSURE DYNAMIC MICRO DIFFERENTIAL PRESSURE GAUGE, AND METHODS FOR USING AND CHECKING THE SAME

CROSS-REFERENCE TO RELATED APPLICATIONS

This application claims priority to Chinese Patent Application No. 201611050075.6, filed on Nov. 24, 2016 and entitled "HIGH PRESSURE DYNAMIC MICRO DIFFERENTIAL PRESSURE GAUGE, AND METHODS FOR USING AND CHECKING THE SAME", which is incorporated herein by reference in its entirety.

TECHNICAL FIELD

The present disclosure relates to the technical field of fluid flow and physical simulation experiment for oil-gas reservoir exploitation, and particularly, to a high-pressure dynamic micro differential pressure gauge, and methods for using and checking the same.

BACKGROUND ART

In the physical simulation experiment related to the oil-gas reservoir exploitation, the pressure of the simulated oil-gas reservoir may be up to more than 30 MPa, while the minimum differential pressure for the simulation experiment of the seepage and oil-displacement which needs to be measured may be less than 0.01 MPa.

The conventional differential pressure gauge cannot accurately measure a micro differential pressure under a high pressure condition of several tens of MPa, and hence cannot accurately measure a dynamic change or fluctuation of the micro differential pressure during the experiment. The principle of the piezoelectric differential pressure transducer is to sense a pressure through a pressure-measuring diaphragm, with the thickened pressure-measuring diaphragm leading to a low measurement accuracy (the deviation is 0.24 MPa) when being used under a high pressure condition (40 MPa). The compensative micro differential pressure gauge is based on the pressure-measuring principle of the U-tube manometer, and its usage pressure range is from 0 MPa to $2.5 \times 10^{-3}$ MPa due to the pressure tolerance limitation of the glass tube. The capacitive micro differential pressure gauge measures a differential pressure by measuring a capacitance variation caused by the differential pressure, and it cannot measure a micro differential pressure under a high pressure condition. The Chinese patent application No. 201510178391.0 discloses a micro differential pressure gauging device for high pressure experiment, which automatically searches a liquid level variation through optical grating, thereby achieving a micro differential pressure measurement under a high pressure condition, with the liquid level identification accuracy reaching 0.1 mm. But the automatic searching by the optical grating takes a long time, and the measurement cannot be completed until the differential pressure becomes steady, thus the continuous gauging of a dynamic micro differential pressure varying with time cannot be realized.

Therefore, the dynamic gauging of a dynamic micro differential pressure for a high pressure experiment is the technical difficulty urgently needs to be solved for experiments related to the oil-gas reservoir (in particular tight oil-gas reservoir) exploration.

SUMMARY OF THE DISCLOSURE

The embodiments of the present disclosure provide a high pressure dynamic micro differential pressure gauge for an accurate measurement of an dynamic micro differential pressure under a high pressure experimental condition, comprising:

a set of vertical manometer tubes in communication with each other, wherein one or more manometer tubes are connected to a resistance meter 2 through signal lines 4; the resistance meter 2 is connected to a data collection and processing control system 3;

each manometer tube is full of low conductivity buffer liquid and high conductivity manometric liquid; the resistance meter 2 is configured to measure resistances in the one or more manometer tubes; and the data collection and processing control system 3 is configured to convert the resistances measured by the resistance meter 2 into a differential pressure.

The embodiments of the present disclosure further provide a method for using the high pressure dynamic micro differential pressure gauge for an accurate measurement of an dynamic micro differential pressure under a high pressure experimental condition, comprising:

filling each manometer tube with low conductivity buffer liquid and high conductivity manometric liquid;

connecting the set of manometer tubes into a high pressure device to be measured;

opening the resistance meter 2 to monitor resistances in the one or more manometer tubes;

opening the data collection and processing control system 3, to convert the resistances measured by the resistance meter 2 into a differential pressure.

The embodiments of the present disclosure further provide a method for checking the high pressure dynamic micro differential pressure gauge for an accurate measurement of an dynamic micro differential pressure under a high pressure experimental condition, comprising:

Connection of an equal number of visible U-tubes in parallel at ambient pressure with the high pressure dynamic micro differential pressure gauge; maintaining a pressure at the tail end, while applying a series of different slight pressure variations to the head end, so as to record resistance data displayed on the resistance meter 2, a liquid level variation in the visible U-tube, and a variation of a micro differential pressure in the high pressure dynamic micro differential pressure gauge.

The high pressure dynamic micro differential pressure gauge in the embodiments of the present disclosure can bear a very high environmental pressure, satisfy the measurement accuracy requirement of the micro differential pressure, achieve a real-time monitoring of the dynamic micro differential pressure under a high pressure, and record a slight differential pressure fluctuation during the experiment in real time.

BRIEF DESCRIPTION OF THE DRAWINGS

In order to more clearly describe the technical solutions in the embodiments of the present disclosure, the drawings to be used in the descriptions of the embodiments will be briefly introduced as follows. Obviously, the drawings in the following descriptions just illustrate some embodiments of the present disclosure, and a person skilled in the art can obtain other drawings from them without paying any creative effort. In which.

DETAILED DESCRIPTION OF THE PREFERRED EMBODIMENTS

In order that the objectives, technical solutions and advantages of the embodiments of the present disclosure are clearer, the embodiments of the present disclosure will be further described in details as follows with reference to the drawings. Here the exemplary embodiments of the present disclosure and descriptions thereof are just used to explain, rather than limiting, the present disclosure.

With respect to limitations to the high pressure micro differential pressure test adaptability by the existing micro differential pressure test instruments and techniques, the embodiments of the present disclosure provide a high pressure dynamic micro differential pressure gauge, in which several manometer tubes in vertical communication with each other are connected to an experimental apparatus to be measured, resistances in one or more manometer tubes are measured with a precise resistance meter to determine a liquid level of an intersection between low conductivity buffer liquid and high conductivity manometric liquid, thereby achieving a real-time monitoring of the micro differential pressure under a high pressure. In the embodiments of the present disclosure, the high pressure dynamic micro differential pressure gauge is mainly composed of manometer tubes, a resistance meter, a data collection and processing control system, low conductivity buffer liquid and high conductivity manometric liquid.

Next, the high pressure dynamic micro differential pressure gauge of the embodiments of the present disclosure will be described in details with reference to FIG. 1. To be noted, in FIG. 1, the technical problem of real-time monitoring of continuous micro differential pressure under a high pressure condition is described through an example in which the high pressure dynamic micro differential pressure gauge includes four manometer tubes. A person skilled in the art shall appreciate that FIG. 1 just illustrates an example of four manometer tubes, and other number of manometer tubes may be set upon demand during the actual application.

Figure 1:
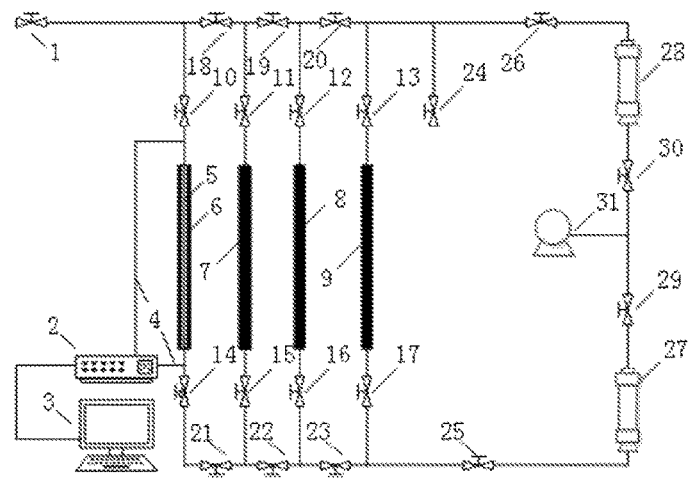
FIG. 1 is a schematic diagram of a high pressure dynamic micro differential pressure gauge in an embodiment of the present disclosure.

As can be seen from FIG. 1, the high pressure dynamic micro differential pressure gauge of the embodiments of the present disclosure may comprise:

a set of vertical manometer tubes in communication with each other, wherein one or more manometer tubes are connected to a resistance meter 2 through signal lines 4; the resistance meter 2 is connected to a data collection and processing control system 3; each manometer tube is full of low conductivity buffer liquid and high conductivity manometric liquid; the resistance meter 2 is configured to measure resistances in the one or more manometer tubes; the data collection and processing control system 3 is configured to convert the resistances measured by the resistance meter 2 into a differential pressure.

In the high pressure dynamic micro differential pressure gauge of the embodiments of the present disclosure, each manometer tube has a pressure tolerance up to 100 MP, and the low conductivity buffer liquid and the high conductivity manometric liquid in each manometer tube can be used under a high pressure experimental environment. One or more manometer tubes are connected to the resistance meter, through which resistances variation in one or more manometer tube is monitored, and monitoring data is fed back to the data collection and processing control system in real time. The data collection and processing control system can acquire a level of the high conductivity manometric liquid in the manometer tubes through the resistance variation, thereby achieving an accurate real-time measurement of the micro differential pressure. In the embodiments, one or more manometer tubes may be connected to the resistance meter, and in FIG. 1, a first manometer tube 6 is connected to the resistance meter 2.

In this embodiment, each manometer tube is full of low conductivity buffer liquid and high conductivity manometric liquid. In another embodiment, alloy wires 5 may be pre-mounted in one or more manometer tubes, as illustrated in FIG. 1. During implementation, the measurement of the high pressure dynamic micro differential pressure can be achieved no matter whether or not the alloy wires 5 are pre-mounted in one or more manometer tubes.

Still as illustrated in FIG. 1, in one embodiment of the present disclosure, the high pressure dynamic micro differential pressure gauge may further comprise: a first intermediate container 27 and a second intermediate container 28 in communication with each manometer tube, respectively, the first intermediate container 27 being filled with high conductivity manometric liquid, and the second intermediate container 28 being filled with low conductivity buffer liquid; and an syringe pump 31 in communication with the first intermediate container 27 and the second intermediate container 28, respectively.

In addition, in the embodiment, a head end and a tail end of each manometer tube may be provided with a valve respectively, and then in communication with other manometer tubes through an intermediate pipeline provided with a valve; a head end pipeline of the first manometer tube 6 is further provided with a head end cut-in valve 1, and a head end pipeline of the last manometer tube 6 is further provided with a tail end cut-in valve 24; the head end cut-in valve 1 is connected to a head end of the high pressure experimental environment, and the tail end cut-in valve 24 is connected to a tail end of the high pressure experimental environment.

Next, detailed descriptions are further given with reference to FIG. 1. As illustrated in FIG. 1, the high pressure dynamic micro differential pressure gauge in the embodiment of the present disclosure comprises:

a head end cut-in valve 1, a resistance meter 2, a data collection and processing control system 3, signal lines 4, an alloy wire 5, a first manometer tube 6, a second manometer tube 7, a third manometer tube 8, a fourth manometer tube 9, a first valve 10, a second valve 11, a third valve 12, a fourth valve 13, a fifth valve 14, a sixth valve 15, a seventh valve 16, an eighth valve 17, a ninth valve 18, a tenth valve 19, an eleventh valve 20, a twelfth valve 21, a thirteenth valve 22, a fourteenth valve 23, a tail end cut-in valve 24, a fifteenth valve 25, a sixteenth valve 26, a first intermediate container 27, a second intermediate container 28, a seventeenth valve 29, an eighteenth valve 30, and an syringe pump 31.

The first manometer tube has the alloy wire 5 pre-mounted therein, and is connected to the resistance meter 2 via the external signal lines 4; the resistance meter 2 is connected to the data collection and processing control system 3; after being connected to the first valve 10, a head end (top) of the first manometer tube 6 is connected to the head end cut-in valve 1, and then connected to a head end of the second manometer tube 7 via the ninth valve 18 and the second valve 11 orderly; a tail end (bottom) of the first manometer tube 6 is connected to a tail end of the second manometer tube 7 via the fifth valve 14, the twelfth valve 21 and the sixth valve 15 orderly; the head end of the second manometer tube 7 is connected to a head end of the third manometer tube 8 via the second valve 11, the tenth valve 19 and the third valve 12 orderly; the tail end of the second manometer tube 7 is connected to a tail end of the third manometer tube 8 via the sixth valve 15, the thirteenth valve 22 and the seventh valve 16 orderly; the head end of the third manometer tube 8 is connected to a head end of the fourth manometer tube 9 via the third valve 12, the eleventh valve 20 and the fourth valve 13 orderly; the tail end of the third manometer tube 8 is connected to a tail end of the fourth manometer tube 9 via the seventh valve 16, the fourteenth valve 23 and the eighth valve 17 orderly; and the head end of the fourth manometer tube 9 is connected to the tail end cut-in valve 24 via the third valve 12.

The head end cut-in valve 1 and the tail end cut-in valve 24 are connected to the high pressure experimental environment from a head end and a tail end respectively, to provide a head end pressure and a tail end pressure for the high pressure dynamic micro differential pressure gauge, and serve as accesses to the high pressure dynamic micro differential pressure gauge. The first intermediate container 27 is filled with high conductivity manometric liquid, and the second intermediate container 28 is filled with low conductivity buffer liquid. The second intermediate container 28 has its top connected to the sixteenth valve 26, and its bottom connected to the eighteenth valve 30; the first intermediate container 27 has its top connected to the seventeenth valve 29, and its bottom connected to the fifteenth valve 25. The first intermediate container 27 is connected to the syringe pump 31 via the seventeenth valve 29, and the second intermediate container 28 is connected to the syringe pump 31 via the eighteenth valve 30. The head end of the fourth manometer tube 9 is also connected to the top of the second intermediate container 28 via the third valve 12 and the sixteenth valve 26. The tail end of the fourth manometer tube 9 is also connected to the bottom of the first intermediate container 27 via the eighth valve 17 and the fifteenth valve 25.

In the example of FIG. 1, a plurality of manometer tubes are in communication with each other, and the alloy wire is mounted into the first manometer tube. Low conductivity buffer liquid is pumped into the plurality of manometer tubes until they are full. The plurality of manometer tubes have high conductivity manometric liquid of a different density pumped therein from their bottoms until the level of the high conductivity manometric liquid reaches the middle of the manometer tubes. Both ends of the first manometer tube are connected to the resistance meter, and then the resistance meter is connected to the data collection and processing control system, so that the resistance in the tube is measured by the resistance meter. The data collection and processing control system can identify a position of the interface between the two electric liquids of different densities based on the resistance measured by the resistance meter, thereby calculating and converting the levels of the two electric liquids of different densities into a differential pressure. It is clear that the high pressure dynamic micro differential pressure gauge in the embodiments of the present disclosure injects two electric manometric liquids of different densities into each manometer tube, and employs the resistance meter and the data collection and processing control system to achieve a real-time monitoring of continuous micro differential pressure under a high pressure condition.

In the embodiment, each manometer tube may be manufactured with a non-metallic high pressure resistant tube, such as a high pressure resistant glass tube or a tube made of other non-metallic high pressure resistant material, and has a pressure tolerance up to 100 MPa. In order to measure a differential pressure of an extremely low flow of fluid within a short experimental time, the inner diameter of the high pressure resistant manometer tube may be set to be very small. For example, the inner diameter of the high pressure resistant manometer tube is greater than or equal to 1 mm while less than or equal to 2 mm, and for instance an inner diameter of 2 mm may be adopted. In order to obtain a wide measurement range for a single set of U-tubes, each manometer tube may have a large length such as greater than or equal to 1.5 m while less than or equal to 2 m. Of course, a person skilled in the art will appreciate that the inner diameter and length of each manometer tube may be other values upon the actual demand.

In the embodiment, the syringe pump 31 may be a high pressure pump, such as an ISCO (100DX) duplex pump with a body volume of 103 ml, a flow rate range of 0.00001-45 ml/min, and a pressure range of 0-70 MPa. In other embodiments, the syringe pump 31 can be configured or adapted to operate with other pressure ranges, such as 0-120 MPa or 0-200 MPa, i.e. a pressure range of up to 200 MPa. The first intermediate container 27 contains high conductivity manometric liquid, which may be hydrargyrum. The second intermediate container 28 contains low conductivity buffer liquid, which may be a saturated sodium chloride solution. When the alloy wire is pre-mounted in the manometer tube, the low conductivity buffer liquid does not need to be the saturated sodium chloride solution, tap water can also be a substitute.

During implementation, one or more manometer tubes are connected to the external resistance meter 2 via the signal lines 4, and then connected to the data collection and processing control system 3 to real-timely control and accurately record a resistance varying with time in the manometer tubes. The signal varying with the resistance may be used to accurately identify the levels of two the liquids of different densities and electrical properties. When low conductivity buffer liquid (e.g., saturated sodium chloride solution) passes, the resistance in the manometer tube becomes the highest, and when high conductivity manometric liquid (e.g., hydrargyrum) passes, the resistance in the manometer tube regularly varies with the position of the interface between the two liquids to provide a strong resistance signal and enable a continuous real-time recording, thereby achieving a real-time monitoring of continuous micro differential pressure under a high pressure condition. In the embodiment of the present disclosure, a precise resistance meter may be used for the measurement, and the measuring frequency may be up to 22 times/second with an accuracy of 0.05%.

In the embodiment of the present disclosure, the high pressure dynamic micro differential pressure gauge may be operated under a high pressure environment, e.g., the high pressure experiment may be carried out at pressure up to 100 MPa. The measured dynamic micro differential pressure may be detected with high accuracy within a small range, e.g., the dynamic micro differential pressure may be within a range from 0 MPa to 2 MPa or more than 2 MPa. The manometer tube can bear a high pressure, such as a pressure up to 100 MPa. In addition, the measurement range is extended with a double U-tube structure. Since the manometer tube is not too long, the measurement range of the differential pressure is small (0~0.2 MPa) when a single set of U-tubes are used; the measurement range of the differential pressure may be extended to 0~0.4 MPa when two sets of U-tubes are used; and the measurement range of the differential pressure may be extended to 0~2 MPa and even higher than 2 MPa when more sets of U-tubes are used.

As can be seen from the above embodiment, the high pressure dynamic micro differential pressure gauge in the embodiment of the present disclosure has the following characteristics:

(1) The high pressure dynamic micro differential pressure gauge in the embodiment of the present disclosure selects a manometer tube that can bear a high environment pressure. As can be seen from the experiment, the selected resistance meter can identify the variations of electric properties of the two manometric liquids in a level of 0.1 Ohm. By adjusting the combination of high conductivity manometric liquid and low conductivity buffer liquid, the lower limit of the resolution of the measurable micro differential pressure is $10^{-8}$ MPa, thereby satisfying the measurement accuracy requirement of the micro differential pressure.

(2) The high pressure dynamic micro differential pressure gauge in the embodiment of the present disclosure can monitor the variation of the resistance in the manometer tube along with the variation of the differential pressure through the resistance meter and the data collection and processing control system, so as to real-timely monitor the variation of the position of the interface between the two liquids in the manometer tube, thereby achieving the purpose of real-timely monitoring a continuous micro differential pressure under a high pressure condition, and accurately recording time-varying characteristics of a slight differential pressure fluctuation during pressure propagation.

A method for using a high pressure dynamic micro differential pressure gauge in the embodiment of the present disclosure may comprise:

filling each manometer tube with low conductivity buffer liquid and high conductivity manometric liquid;

connecting the set of manometer tubes into a high pressure device to be measured;

opening the resistance meter 2 to monitor resistances in the one or more manometer tube;

opening the data collection and processing control system 3, to convert the resistances measured by the resistance meter 2 into a differential pressure.

Next, the method for using the high pressure dynamic micro differential pressure gauge in the embodiment of the present disclosure will be described in details with reference to FIG. 1. As illustrated in FIG. 1, the specific operation process may comprise:

before starting the high pressure dynamic micro differential pressure gauge, connecting upper portions of four manometer tubes into a second intermediate container 28 via a first valve 10, a second valve 11, a third valve 12, a fourth valve 13, a ninth valve 18, a tenth valve 19, an eleventh valve 20 and a sixteenth valve 26 through pipelines, respectively; and connecting lower portions thereof into a first intermediate container 27 via a fifth valve 14, a sixth valve 15, a seventh valve 16, an eighth valve 17, a twelfth valve 21, a thirteenth valve 22, a fourteenth valve 23 and a fifteenth valve 25 through pipelines, respectively; and opening a head end cut-in valve 1, the first valve 10, the second valve 11, the third valve 12, the fourth valve 13, the fifth valve 14, the sixth valve 15, the seventh valve 16, the eighth valve 17, the tenth valve 19, the twelfth valve 21, the fourteenth valve 23, a tail end cut-in valve 24, the sixteenth valve 26, and an eighteenth valve 30, while closing other valves.

After the operations on the above valves are completed, an syringe pump 31 injects low conductivity buffer liquid in the second intermediate container 28 into the manometer tubes at a constant flow rate (0.1-1 ml/min) until the manometer tubes are full.

After the manometer tubes are full of low conductivity buffer liquid, the fifth valve 14, the sixth valve 15, the seventh valve 16, the eighth valve 17, the twelfth valve 21, the thirteenth valve 22, the fourteenth valve 23, the fifteenth valve 25 and the seventeenth valve 29 are opened, and other valves are closed. Under the pressure of the syringe pump 31, high conductivity manometric liquid (e.g., hydrargyrum) is pumped to fill a half of the manometer tubes.

After the levels of high conductivity manometric liquid in the manometer tubes are aligned, the head end cut-in valve 1, the first valve 10, the second valve 11, the third valve 12, the fourth valve 13, the ninth valve 18, the tenth valve 19 and the eleventh valve 20 are opened, and other valves are closed. The head end cut-in valve 1 is connected to the head end of the high pressure experimental environment.

After the head end cut-in valve 1 is connected to the head end of the high pressure experimental environment, the ninth valve 18, the eleventh valve 20, the thirteenth valve 22, the fifteenth valve 25, the sixteenth valve 26, the seventeenth valve 29 and the eighteenth valve 30 are closed, and other valves are opened. The tail end cut-in valve 24 is connected to the tail end of the high pressure experimental environment.

The resistance meter 2 and the data collection and processing control system 3 are started to prepare the measurement record. The resistance variations of the resistance meter 2 and the data collection and processing control system 3 are monitored to record the resistances, which are converted to obtain a differential pressure.

High conductivity manometric liquid (e.g., hydrargyrum) is pumped into the manometer tubes until it reaches a middle position. In that case, the resistor of high conductivity manometric liquid is parallel with the resistor of low conductivity buffer liquid. When there is an extremely slight differential pressure, the liquid levels in the manometer tubes is moved, and the pressure at the inlet end is high; the interface between the two liquids of different densities and electric properties rises, and the resistance decreases; thus the interface between low conductivity buffer liquid and high conductivity manometric liquid can be accurately identified; the position of the interface can be obtained from the resistance variation, and converted into a differential pressure.

An embodiment of the present disclosure further provide a method for checking the high pressure dynamic micro differential pressure gauge, wherein an equal number of visible U-tubes are connected in parallel at ambient pressure with the high pressure dynamic micro differential pressure gauge in the embodiment of the present disclosure; the pressure at the tail end is maintained, while a series of different slight pressure variations are applied to the head end, so as to record resistance data displayed on the resistance meter, a liquid level variation in the visible U-tube, and a variation of the micro differential pressure in the high pressure dynamic micro differential pressure gauge in the embodiment of the present disclosure. In order to achieve an accurate check, the visible U-tube may be a transparent plastic tube of the same specification as the high pressure dynamic micro differential pressure gauge in the embodiment of the present disclosure.

Figure 2:
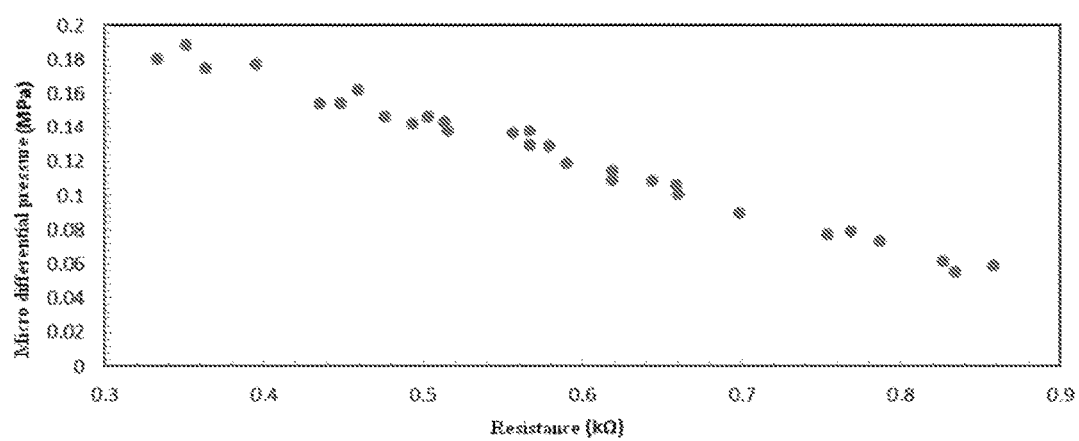
FIG. 2 is a schematic diagram of a resistance-differential pressure measurement calibration under a normal pressure in an embodiment of the present disclosure.

In the embodiment, according to the resistance data displayed on the resistance meter, the liquid level variation in the visible U-tube, and the variation of the micro differential pressure in the high pressure dynamic micro differential pressure gauge in the embodiment of the present disclosure, the relation between resistance-differential pressure may be regressed to establish a standard line. FIG. 2 illustrates a schematic diagram of a resistance-height (differential pressure) measurement calibration under a normal pressure, and a standard line formula can be obtained from a resistance-height (micro differential pressure) measurement check result:

$$P=-0.25456R+0.27242;$$

wherein, P is a micro differential pressure, and R is a resistance.

The standard line formula may be used as a criterion for the resistance-differential pressure conversion relation when the high pressure dynamic micro differential pressure gauge in the embodiment of the present disclosure is used. As to the high pressure dynamic micro differential pressure gauge in the embodiment of the present disclosure, once the manometer tubes of identical specification are used and equal volume of high conductivity manometric liquid are pumped into the tubes, the same standard line formula may be used for the resistance-differential pressure conversion.

Herein the high pressure dynamic micro differential pressure gauge in the embodiment of the present disclosure may utilize the pressure-measuring principle of the U-tube, adopts high pressure resistance insulation tubes as the manometer tubes, and display a resistance in a passage of the manometer tube through a precise resistance meter and a data collection and processing control system, so as to identify levels of two liquids of different densities and electric properties, thereby calculating a height of an interface between the two liquids of different densities and electric properties, converting the height into a differential pressure for being displayed and recorded. The minimum accuracy of the high pressure dynamic micro differential pressure gauge in the embodiment of the present disclosure can be $2.5456 \times 10^{-5}$ MPa.

To sum up, the high pressure dynamic micro differential pressure gauge in the embodiment of the present disclosure can bear a very high environmental pressure, satisfy the measurement accuracy requirement of the micro differential pressure, achieve a real-time monitoring of the dynamic micro differential pressure under a high pressure, and record a slight differential pressure fluctuation during the experiment in real time.

The high pressure dynamic micro differential pressure gauge in the embodiment of the present disclosure is adaptive to the measurement of an dynamic micro differential pressure under a high pressure experiment, and particularly, adaptive to a real-time measurement of a micro-scale flow under a high pressure environment and a slight pressure fluctuation in the seepage environment.

A person skilled in the art shall understand that the embodiment of the present disclosure can be provided as a method, a system or a computer program product. Therefore, the present disclosure can take the form of a full hardware embodiment, a full software embodiment, or an embodiment combining software and hardware aspects. Moreover, the present disclosure can take the form of a computer program product implemented on one or more computer usable storage mediums (including, but not limited to, a magnetic disc memory, CD-ROM, optical storage, etc.) containing therein computer usable program codes.

The present disclosure is described with reference to a flow diagram and/or block diagram of the method, device (system) and computer program product according to the embodiments of the present disclosure. It shall be understood that each flow and/or block in the flow diagram and/or block diagram and a combination of the flow and/or block in the flow diagram and/or block diagram can be realized by the computer program instructions. These computer program instructions can be provided to a general computer, a dedicated computer, an embedded processor or a processor of other programmable data processing device to generate a machine, such that the instructions performed by the computer or the processor of other programmable data processing devices generate the device for implementing the function designated in one flow or a plurality of flows in the flow diagram and/or a block or a plurality of blocks in the block diagram.

These computer program instructions can also be stored in a computer readable memory capable of directing the computer or other programmable data processing devices to operate in a specific manner, such that the instructions stored in the computer readable memory generate a manufactured article including an instruction device that implements the function(s) designated in one flow or a plurality of flows in the flow diagram and/or a block or a plurality of blocks in the block diagram.

These computer program instructions can also be loaded onto the computer or other programmable data processing devices, such that a series of operation steps is executed on the computer or other programmable devices to generate the processing realized by the computer, therefore the instructions executed on the computer or other programmable devices provide the steps for implementing the function designated in one flow or a plurality of flows in the flow chart and/or a block or a plurality of blocks in the block diagram.

The above embodiments further describe the objectives, technical solutions and beneficial effects of the present disclosure in details. It shall be appreciated that the above descriptions only illustrate the specific embodiments of the present disclosure, and are not used for limiting the protection scope of the present disclosure. Any modification, equivalent substitution and improvement made within the spirit and principle of the present disclosure shall be contained in the protection scope of the present disclosure.

The invention claimed is:

1. A high pressure dynamic micro differential pressure gauge, comprising:
    a set of vertical manometer tubes in communication with each other, wherein one or more of the manometer tubes are connected to a resistance meter (2) through signal lines (4), and wherein:
    the resistance meter (2) is connected to a data collection and processing control system (3);
    each manometer tube is full of low conductivity buffer liquid and high conductivity manometric liquid;
    the resistance meter (2) is configured to measure resistances in the one or more manometer tubes; and
    the data collection and processing control system (3) is configured to convert the resistances measured by the resistance meter (2) into a differential pressure.

2. The high pressure dynamic micro differential pressure gauge according to claim 1, wherein alloy wires (5) are pre-mounted in one or more of the manometer tubes.

3. The high pressure dynamic micro differential pressure gauge according to claim 1, wherein an inner diameter of each manometer tube is greater than or equal to 1 mm and less than or equal to 2 mm, and wherein each manometer tube has a length which is greater than or equal to 1.5 m and less than or equal to 2 m.

4. The high pressure dynamic micro differential pressure gauge according to claim 1, wherein the low conductivity buffer liquid is a saturated sodium chloride solution.

5. The high pressure dynamic micro differential pressure gauge according to claim 1, further comprising:
   a first intermediate container (27) and a second intermediate container (28) in communication with each manometer tube, respectively, wherein the first intermediate container (27) contains the high conductivity manometric liquid and the second intermediate container (28) contains the low conductivity buffer liquid; and
   a syringe pump (31) in communication with the first intermediate container (27) and the second intermediate container (28), respectively.

6. The high pressure dynamic micro differential pressure gauge according to claim 5, wherein the syringe pump (31) is a high pressure pump having a pressure range of up to 200 MPa.

7. The high pressure dynamic micro differential pressure gauge according to claim 1, wherein:
   a head end and a tail end of each manometer tube is provided with a valve, respectively, and wherein each manometer tube is in communication with other manometer tubes through an intermediate pipeline provided with a valve;
   a head end pipeline of a first manometer tube (6) is further provided with a head end cut-in valve (1), and a head end pipeline of a last manometer tube (6) is further provided with a tail end cut-in valve (24); and
   the head end cut-in valve (1) is connected to a head end of a high pressure experimental environment, and the tail end cut-in valve (24) is connected to a tail end of the high pressure experimental environment.

8. The high pressure dynamic micro differential pressure gauge according to claim 1, wherein the high pressure dynamic micro differential pressure gauge is used for a high pressure experiment below 100 MPa.

9. The high pressure dynamic micro differential pressure gauge according to claim 1, wherein the high conductivity manometric liquid is hydrargyrum.

10. A method for using a high pressure dynamic micro differential pressure gauge according to claim 1, comprising:
    filling each manometer tube with low conductivity buffer liquid and high conductivity manometric liquid;
    connecting the set of manometer tubes into a high pressure device to be measured;
    opening the resistance meter (2) to monitor resistances in the one or more manometer tubes; and
    opening the data collection and processing control system (3) to convert the resistances measured by the resistance meter (2) into a differential pressure.

11. A method for checking a high pressure dynamic micro differential pressure gauge, said micro differential pressure gauge comprising:
    a set of vertical manometer tubes in communication with each other, wherein one or more of the manometer tubes are connected to a resistance meter (2) through signal lines (4), and wherein:
    the resistance meter (2) is connected to a data collection and processing control system (3);
    each manometer tube is full of low conductivity buffer liquid and high conductivity manometric liquid;
    the resistance meter (2) is configured to measure resistances in the one or more manometer tubes; and
    the data collection and processing control system (3) is configured to convert the resistances measured by the resistance meter (2) into a differential pressure,
    said method comprising:
    connecting an equal number of visible U-tubes in parallel at ambient pressure with the high pressure dynamic micro differential pressure gauge; and
    maintaining a pressure at the tail end while applying a series of different slight pressure variations to the head end, so as to record resistance data displayed on the resistance meter (2), a liquid level variation in the visible U-tube, and a variation of a micro differential pressure in the high pressure dynamic micro differential pressure gauge.

\* \* \* \* \*